(12) United States Patent
O'Shea

(10) Patent No.: US 9,710,745 B1
(45) Date of Patent: Jul. 18, 2017

(54) SYSTEMS AND METHODS FOR AUTOMATED ASSEMBLY OF DYNAMIC MAGNETIC STRIPE COMMUNICATIONS DEVICES

(71) Applicant: Norman E. O'Shea, Seven Fields, PA (US)

(72) Inventor: Norman E. O'Shea, Seven Fields, PA (US)

(73) Assignee: DYNAMICS INC., Pittsburgh, PA (US)

( * ) Notice: Subject to any disclaimer, the term of this patent is extended or adjusted under 35 U.S.C. 154(b) by 0 days.

(21) Appl. No.: 13/762,497

(22) Filed: Feb. 8, 2013

Related U.S. Application Data

(60) Provisional application No. 61/597,105, filed on Feb. 9, 2012.

(51) Int. Cl.
*B32B 37/00* (2006.01)
*G06K 19/077* (2006.01)
(Continued)

(52) U.S. Cl.
CPC .... *G06K 19/07718* (2013.01); *B32B 37/1054* (2013.01); *B32B 37/226* (2013.01);
(Continued)

(58) Field of Classification Search
CPC ..... B32B 37/22; B32B 37/223; B32B 37/226; B32B 37/1054; G06K 19/077;
(Continued)

(56) References Cited

U.S. PATENT DOCUMENTS 3,455,770 A * 7/1969 Dahl, Jr. .......................... 428/43
3,526,562 A * 9/1970 Dahl, Jr. ........................ 156/519
(Continued)

FOREIGN PATENT DOCUMENTS

JP 05210770 A 8/1993
WO WO9852735 11/1998
(Continued)

OTHER PUBLICATIONS

U.S. Appl. No. 60/594,300, Poidomani et al.
(Continued)

*Primary Examiner* — John Goff

(57) ABSTRACT

An automated conveyor system extends a continuous layer of plastic onto a moving conveyor. A pair of damming strips may be applied to the continuous layer of plastic as the conveyor advances. A liquid material may be sprayed between the damming strips and electronic assemblies may be robotically picked and placed onto the continuous layer of plastic between the damming strips and on top of the liquid material. Additional liquid material may be sprayed on top of the electronic assemblies as the conveyor moves. A continuous top plastic layer may be extended on top of the electronic assemblies, while a roller compresses the electronic assemblies between the top plastic layer and bottom plastic layer. A transparent clamp holds a portion of the compressed sub-assembly in place while the sub-assembly is cured. A sheering station sheers the sub-assembly as the conveyor indexes.

24 Claims, 6 Drawing Sheets

(51) Int. Cl.
*H05K 13/00* (2006.01)
*B32B 37/10* (2006.01)
*B32B 37/22* (2006.01)

(52) U.S. Cl.
CPC ..... *G06K 19/077* (2013.01); *G06K 19/07722* (2013.01); *H05K 13/0023* (2013.01); *Y10T 156/1093* (2015.01); *Y10T 156/1097* (2015.01)

(58) Field of Classification Search
CPC ........ G06K 19/07718; G06K 19/07722; Y10T 156/1093; Y10T 156/1095; Y10T 156/1097
USPC ....... 156/265, 297, 300, 301, 302, 303, 298, 156/324, 272.2, 275.5, 275.7, 295, 242, 156/245; 427/300; 235/487, 488
See application file for complete search history.

(56) References Cited

U.S. PATENT DOCUMENTS

| | | | |
|---|---|---|---|
| 4,353,064 A | 10/1982 | Stamm | |
| 4,394,654 A | 7/1983 | Hofmann-Cerfontaine | |
| 4,614,861 A | 9/1986 | Pavlov et al. | |
| 4,667,087 A | 5/1987 | Quintana | |
| 4,701,601 A | 10/1987 | Francini et al. | |
| 4,720,860 A | 1/1988 | Weiss | |
| 4,786,791 A | 11/1988 | Hodama | |
| 4,791,283 A | 12/1988 | Burkhardt | |
| 4,797,542 A | 1/1989 | Hara | |
| 5,038,251 A | 8/1991 | Sugiyama et al. | |
| 5,168,520 A | 12/1992 | Weiss | |
| 5,237,614 A | 8/1993 | Weiss | |
| 5,276,311 A | 1/1994 | Hennige | |
| 5,347,580 A | 9/1994 | Molva et al. | |
| 5,361,062 A | 11/1994 | Weiss et al. | |
| 5,412,199 A | 5/1995 | Finkelstein et al. | |
| 5,434,398 A | 7/1995 | Goldberg | |
| 5,434,405 A | 7/1995 | Finkelstein et al. | |
| 5,478,994 A | 12/1995 | Rahman | |
| 5,479,512 A | 12/1995 | Weiss | |
| 5,484,997 A | 1/1996 | Haynes | |
| 5,485,519 A | 1/1996 | Weiss | |
| 5,512,126 A * | 4/1996 | Kannabiran et al. | 156/380.9 |
| 5,566,441 A * | 10/1996 | Marsh et al. | 29/600 |
| 5,585,787 A | 12/1996 | Wallerstein | |
| 5,591,949 A | 1/1997 | Bernstein | |
| 5,608,203 A | 3/1997 | Finkelstein et al. | |
| 5,623,552 A | 4/1997 | Lane | |
| 5,637,858 A * | 6/1997 | Hoppe et al. | 235/492 |
| 5,657,388 A | 8/1997 | Weiss | |
| 5,804,026 A * | 9/1998 | Vogt | 156/295 |
| 5,817,207 A * | 10/1998 | Leighton | 156/298 |
| 5,834,747 A | 11/1998 | Cooper | |
| 5,834,756 A | 11/1998 | Gutman et al. | |
| 5,856,661 A | 1/1999 | Finkelstein et al. | |
| 5,864,623 A | 1/1999 | Messina et al. | |
| 5,907,142 A | 5/1999 | Kelsey | |
| 5,913,203 A | 6/1999 | Wong et al. | |
| 5,937,394 A | 8/1999 | Wong et al. | |
| 5,952,713 A * | 9/1999 | Takahira et al. | 257/679 |
| 5,955,021 A | 9/1999 | Tiffany, III | |
| 5,955,961 A | 9/1999 | Wallerstein | |
| 5,956,699 A | 9/1999 | Wong et al. | |
| 6,025,054 A | 2/2000 | Tiffany, III | |
| 6,045,043 A | 4/2000 | Bashan et al. | |
| 6,076,163 A | 6/2000 | Hoffstein et al. | |
| 6,085,320 A | 7/2000 | Kaliski | |
| 6,095,416 A | 8/2000 | Grant et al. | |
| 6,130,621 A | 10/2000 | Weiss | |
| 6,145,079 A | 11/2000 | Mitty et al. | |
| 6,157,920 A | 12/2000 | Jakobsson et al. | |
| 6,161,181 A | 12/2000 | Haynes, III et al. | |
| 6,176,430 B1 | 1/2001 | Finkelstein et al. | |
| 6,182,894 B1 | 2/2001 | Hackett et al. | |
| 6,189,098 B1 | 2/2001 | Kaliski | |
| 6,199,052 B1 | 3/2001 | Mitty et al. | |
| 6,206,293 B1 | 3/2001 | Gutman et al. | |
| 6,240,184 B1 | 5/2001 | Huynh et al. | |
| 6,241,153 B1 | 6/2001 | Tiffany, III | |
| 6,256,873 B1 | 7/2001 | Tiffany, III | |
| 6,269,163 B1 | 7/2001 | Rivest et al. | |
| 6,286,022 B1 | 9/2001 | Kaliski et al. | |
| 6,305,609 B1 * | 10/2001 | Melzer et al. | 235/487 |
| 6,308,890 B1 | 10/2001 | Cooper | |
| 6,313,724 B1 | 11/2001 | Osterweil | |
| 6,389,442 B1 | 5/2002 | Yin et al. | |
| 6,393,447 B1 | 5/2002 | Jakobsson et al. | |
| 6,399,004 B1 * | 6/2002 | Slager | 264/254 |
| 6,411,715 B1 | 6/2002 | Liskov et al. | |
| 6,446,052 B1 | 9/2002 | Juels | |
| 6,460,141 B1 | 10/2002 | Olden | |
| 6,592,044 B1 | 7/2003 | Wong et al. | |
| 6,607,127 B2 | 8/2003 | Wong | |
| 6,607,135 B1 * | 8/2003 | Hirai et al. | 235/487 |
| 6,609,654 B1 | 8/2003 | Anderson et al. | |
| 6,631,849 B2 | 10/2003 | Blossom | |
| 6,655,585 B2 | 12/2003 | Shinn | |
| 6,681,988 B2 | 1/2004 | Stack et al. | |
| 6,705,520 B1 | 3/2004 | Pitroda et al. | |
| 6,755,341 B1 | 6/2004 | Wong et al. | |
| 6,764,005 B2 | 7/2004 | Cooper | |
| 6,769,618 B1 | 8/2004 | Finkelstein | |
| 6,805,288 B2 | 10/2004 | Routhenstein et al. | |
| 6,811,082 B2 | 11/2004 | Wong | |
| 6,813,354 B1 | 11/2004 | Jakobsson et al. | |
| 6,817,532 B2 | 11/2004 | Finkelstein | |
| 6,873,974 B1 | 3/2005 | Schutzer | |
| 6,902,116 B2 | 6/2005 | Finkelstein | |
| 6,970,070 B2 | 11/2005 | Juels et al. | |
| 6,980,969 B1 | 12/2005 | Tuchler et al. | |
| 6,985,583 B1 | 1/2006 | Brainard et al. | |
| 6,991,155 B2 | 1/2006 | Burchette, Jr. | |
| 7,013,030 B2 | 3/2006 | Wong et al. | |
| 7,035,443 B2 | 4/2006 | Wong | |
| 7,039,223 B2 | 5/2006 | Wong | |
| 7,044,394 B2 | 5/2006 | Brown | |
| 7,051,929 B2 | 5/2006 | Li | |
| 7,083,094 B2 | 8/2006 | Cooper | |
| 7,100,049 B2 | 8/2006 | Gasparini et al. | |
| 7,100,821 B2 | 9/2006 | Rasti | |
| 7,111,172 B1 | 9/2006 | Duane et al. | |
| 7,114,652 B2 | 10/2006 | Moullette et al. | |
| 7,136,514 B1 | 11/2006 | Wong | |
| 7,140,550 B2 | 11/2006 | Ramachandran | |
| 7,163,153 B2 | 1/2007 | Blossom | |
| 7,195,154 B2 | 3/2007 | Routhenstein | |
| 7,197,639 B1 | 3/2007 | Juels et al. | |
| 7,219,368 B2 | 5/2007 | Juels et al. | |
| 7,225,537 B2 | 6/2007 | Reed | |
| 7,225,994 B2 | 6/2007 | Finkelstein | |
| 7,246,752 B2 | 7/2007 | Brown | |
| 7,298,243 B2 | 11/2007 | Juels et al. | |
| 7,334,732 B2 | 2/2008 | Cooper | |
| 7,337,326 B2 | 2/2008 | Palmer et al. | |
| 7,346,775 B2 | 3/2008 | Gasparinl et al. | |
| 7,356,696 B1 | 4/2008 | Jakobsson et al. | |
| 7,357,319 B1 | 4/2008 | Liu et al. | |
| 7,359,507 B2 | 4/2008 | Kaliski | |
| 7,360,688 B1 | 4/2008 | Harris | |
| 7,363,494 B2 | 4/2008 | Brainard et al. | |
| 7,380,710 B2 | 6/2008 | Brown | |
| 7,398,253 B1 | 7/2008 | Pinnell | |
| 7,404,087 B2 | 7/2008 | Teunen | |
| 7,424,570 B2 | 9/2008 | D'Albore et al. | |
| 7,427,033 B1 | 9/2008 | Roskind | |
| 7,454,349 B2 | 11/2008 | Teunen et al. | |
| 7,461,250 B1 | 12/2008 | Duane et al. | |
| 7,461,399 B2 | 12/2008 | Juels et al. | |
| 7,472,093 B2 | 12/2008 | Juels | |
| 7,472,829 B2 | 1/2009 | Brown | |
| 7,494,055 B2 | 2/2009 | Fernandes et al. | |
| 7,502,467 B2 | 3/2009 | Brainard et al. | |
| 7,502,933 B2 | 3/2009 | Jakobsson et al. | |

(56) References Cited

U.S. PATENT DOCUMENTS

| | | |
|---|---|---|
| 7,503,485 B1 | 3/2009 | Routhenstein |
| 7,516,492 B1 | 4/2009 | Nisbet et al. |
| 7,523,301 B2 | 4/2009 | Nisbet et al. |
| 7,530,495 B2 | 5/2009 | Cooper |
| 7,532,104 B2 | 5/2009 | Juels |
| 7,543,739 B2 | 6/2009 | Brown et al. |
| 7,559,464 B2 | 7/2009 | Routhenstein |
| 7,562,221 B2 | 7/2009 | Nystrom et al. |
| 7,562,222 B2 | 7/2009 | Gasparini et al. |
| 7,580,898 B2 | 8/2009 | Brown et al. |
| 7,584,153 B2 | 9/2009 | Brown et al. |
| 7,591,426 B2 | 9/2009 | Osterweil et al. |
| 7,591,427 B2 | 9/2009 | Osterweil |
| 7,602,904 B2 | 10/2009 | Juels et al. |
| 7,631,804 B2 | 12/2009 | Brown |
| 7,639,537 B2 | 12/2009 | Sepe et al. |
| 7,641,124 B2 | 1/2010 | Brown et al. |
| 7,660,902 B2 | 2/2010 | Graham et al. |
| 7,784,687 B2 | 8/2010 | Mullen et al. |
| 7,793,851 B2 | 9/2010 | Mullen |
| 7,828,207 B2 | 11/2010 | Cooper |
| 7,828,220 B2 | 11/2010 | Mullen |
| 7,931,195 B2 | 4/2011 | Mullen |
| 7,946,501 B2 | 5/2011 | Borracci et al. |
| 7,954,705 B2 | 6/2011 | Mullen |
| 8,011,577 B2 | 9/2011 | Mullen et al. |
| 8,020,775 B2 | 9/2011 | Mullen et al. |
| 8,066,191 B1 | 11/2011 | Cloutier et al. |
| 8,074,877 B2 | 12/2011 | Mullen et al. |
| 8,172,148 B1 | 5/2012 | Cloutier et al. |
| 8,282,007 B1 | 10/2012 | Cloutier et al. |
| 8,286,876 B2 | 10/2012 | Mullen et al. |
| 8,302,872 B2 | 11/2012 | Mullen |
| 8,322,623 B1 | 12/2012 | Mullen et al. |
| 8,348,172 B1 | 1/2013 | Cloutier et al. |
| 8,382,000 B2 | 2/2013 | Mullen et al. |
| 8,393,545 B1 | 3/2013 | Mullen et al. |
| 8,393,546 B1 | 3/2013 | Yen et al. |
| 8,413,892 B2 | 4/2013 | Mullen et al. |
| 8,424,773 B2 | 4/2013 | Mullen et al. |
| 8,459,548 B2 | 6/2013 | Mullen et al. |
| 8,485,437 B2 | 7/2013 | Mullen et al. |
| 8,485,446 B1 | 7/2013 | Mullen et al. |
| 8,511,574 B1 | 8/2013 | Yen et al. |
| 8,517,276 B2 | 8/2013 | Mullen et al. |
| 8,523,059 B1 | 9/2013 | Mullen et al. |
| 8,561,894 B1 | 10/2013 | Mullen et al. |
| 8,567,679 B1 | 10/2013 | Mullen et al. |
| 8,573,503 B1 | 11/2013 | Cloutier et al. |
| 8,579,203 B1 | 11/2013 | Lambeth et al. |
| 8,590,796 B1 | 11/2013 | Cloutier et al. |
| 8,602,312 B2 | 12/2013 | Cloutier et al. |
| 8,608,083 B2 | 12/2013 | Mullen et al. |
| 8,622,309 B1 | 1/2014 | Mullen et al. |
| 8,628,022 B1 | 1/2014 | Rhoades et al. |
| 8,668,143 B2 | 3/2014 | Mullen et al. |
| 8,727,219 B1 | 5/2014 | Mullen |
| 8,733,638 B2 | 5/2014 | Mullen et al. |
| 8,746,579 B1 | 6/2014 | Cloutier et al. |
| 8,757,483 B1 | 6/2014 | Mullen et al. |
| 8,757,499 B2 | 6/2014 | Cloutier et al. |
| 8,814,050 B1 | 8/2014 | Mullen et al. |
| 8,827,153 B1 | 9/2014 | Rhoades et al. |
| 8,881,989 B2 | 11/2014 | Mullen et al. |
| 8,888,009 B1 | 11/2014 | Mullen |
| 8,944,333 B1 | 2/2015 | Mullen et al. |
| 8,960,545 B1 | 2/2015 | Batra |
| 8,973,824 B2 | 3/2015 | Mullen et al. |
| 9,004,368 B2 | 4/2015 | Mullen et al. |
| 9,010,630 B2 | 4/2015 | Mullen et al. |
| 9,053,398 B1 | 6/2015 | Cloutier |
| 9,064,194 B1 | 6/2015 | Bohac, Jr. |
| 9,064,255 B1 | 6/2015 | Mullen et al. |
| 2001/0034702 A1 | 10/2001 | Mockett et al. |
| 2001/0047335 A1 | 11/2001 | Arndt et al. |
| 2002/0059114 A1 | 5/2002 | Cockrill et al. |
| 2002/0082989 A1 | 6/2002 | Fife et al. |
| 2002/0096570 A1 | 7/2002 | Wong et al. |
| 2002/0120583 A1 | 8/2002 | Keresman, III et al. |
| 2003/0034388 A1 | 2/2003 | Routhenstein et al. |
| 2003/0052168 A1 | 3/2003 | Wong |
| 2003/0057278 A1 | 3/2003 | Wong |
| 2003/0116635 A1 | 6/2003 | Taban |
| 2003/0152253 A1 | 8/2003 | Wong |
| 2003/0163287 A1 | 8/2003 | Vock et al. |
| 2003/0173409 A1 | 9/2003 | Vogt et al. |
| 2003/0179909 A1 | 9/2003 | Wong et al. |
| 2003/0179910 A1 | 9/2003 | Wong |
| 2003/0226899 A1 | 12/2003 | Finkelstein |
| 2004/0035942 A1 | 2/2004 | Silverman |
| 2004/0133787 A1 | 7/2004 | Doughty |
| 2004/0162732 A1 | 8/2004 | Rahim et al. |
| 2004/0172535 A1 | 9/2004 | Jakobsson |
| 2004/0177045 A1 | 9/2004 | Brown |
| 2005/0043997 A1 | 2/2005 | Sohata et al. |
| 2005/0080747 A1 | 4/2005 | Anderson et al. |
| 2005/0086160 A1 | 4/2005 | Wong et al. |
| 2005/0086177 A1 | 4/2005 | Anderson et al. |
| 2005/0116026 A1 | 6/2005 | Burger et al. |
| 2005/0119940 A1 | 6/2005 | Concilio et al. |
| 2005/0154643 A1 | 7/2005 | Doan et al. |
| 2005/0228959 A1 | 10/2005 | D'Albore et al. |
| 2006/0000900 A1 | 1/2006 | Fernandes et al. |
| 2006/0037073 A1 | 2/2006 | Juels et al. |
| 2006/0041759 A1 | 2/2006 | Kaliski et al. |
| 2006/0085328 A1 | 4/2006 | Cohen et al. |
| 2006/0091223 A1 | 5/2006 | Zellner |
| 2006/0161435 A1 | 7/2006 | Atef et al. |
| 2006/0163353 A1 | 7/2006 | Moulette et al. |
| 2006/0174104 A1 | 8/2006 | Crichton et al. |
| 2006/0196931 A1 | 9/2006 | Holtmanns et al. |
| 2006/0256961 A1 | 11/2006 | Brainard et al. |
| 2007/0034700 A1 | 2/2007 | Poidomani et al. |
| 2007/0114274 A1 | 5/2007 | Gibbs et al. |
| 2007/0124321 A1 | 5/2007 | Szydlo |
| 2007/0152070 A1 | 7/2007 | D'Albore |
| 2007/0152072 A1 | 7/2007 | Frallicciardi et al. |
| 2007/0153487 A1 | 7/2007 | Frallicciardi et al. |
| 2007/0174614 A1 | 7/2007 | Duane et al. |
| 2007/0192249 A1 | 8/2007 | Biffle et al. |
| 2007/0241183 A1 | 10/2007 | Brown et al. |
| 2007/0241201 A1 | 10/2007 | Brown et al. |
| 2007/0256123 A1 | 11/2007 | Duane et al. |
| 2007/0291753 A1 | 12/2007 | Romano |
| 2008/0005510 A1 | 1/2008 | Sepe et al. |
| 2008/0008315 A1 | 1/2008 | Fontana et al. |
| 2008/0008322 A1 | 1/2008 | Fontana et al. |
| 2008/0010675 A1 | 1/2008 | Massascusa et al. |
| 2008/0016351 A1 | 1/2008 | Fontana et al. |
| 2008/0019507 A1 | 1/2008 | Fontana et al. |
| 2008/0028447 A1 | 1/2008 | O'Malley et al. |
| 2008/0035738 A1 | 2/2008 | Mullen |
| 2008/0040271 A1 | 2/2008 | Hammad et al. |
| 2008/0040276 A1 | 2/2008 | Hammad et al. |
| 2008/0058016 A1 | 3/2008 | Di Maggio et al. |
| 2008/0059379 A1 | 3/2008 | Ramaci et al. |
| 2008/0065555 A1 | 3/2008 | Mullen |
| 2008/0096326 A1 | 4/2008 | Reed |
| 2008/0126398 A1 | 5/2008 | Cimino |
| 2008/0128515 A1 | 6/2008 | Di Iorio |
| 2008/0148394 A1 | 6/2008 | Poidomani et al. |
| 2008/0201264 A1 | 8/2008 | Brown et al. |
| 2008/0209550 A1 | 8/2008 | Di Iorio |
| 2008/0288699 A1 | 11/2008 | Chichierchia |
| 2008/0294930 A1 | 11/2008 | Varone et al. |
| 2008/0302869 A1 | 12/2008 | Mullen |
| 2008/0302876 A1 | 12/2008 | Mullen |
| 2008/0302877 A1 | 12/2008 | Musella et al. |
| 2009/0013122 A1 | 1/2009 | Sepe et al. |
| 2009/0036147 A1 | 2/2009 | Romano |
| 2009/0046522 A1 | 2/2009 | Sepe et al. |
| 2009/0108064 A1 | 4/2009 | Fernandes et al. |
| 2009/0150295 A1 | 6/2009 | Hatch et al. |
| 2009/0152365 A1 | 6/2009 | Li et al. |

(56) References Cited

U.S. PATENT DOCUMENTS

| | | |
|---|---|---|
| 2009/0159663 A1 | 6/2009 | Mullen et al. |
| 2009/0159667 A1 | 6/2009 | Mullen et al. |
| 2009/0159669 A1 | 6/2009 | Mullen et al. |
| 2009/0159670 A1 | 6/2009 | Mullen et al. |
| 2009/0159671 A1 | 6/2009 | Mullen et al. |
| 2009/0159672 A1 | 6/2009 | Mullen et al. |
| 2009/0159673 A1 | 6/2009 | Mullen et al. |
| 2009/0159680 A1 | 6/2009 | Mullen et al. |
| 2009/0159681 A1 | 6/2009 | Mullen et al. |
| 2009/0159682 A1 | 6/2009 | Mullen et al. |
| 2009/0159690 A1 | 6/2009 | Mullen et al. |
| 2009/0159696 A1 | 6/2009 | Mullen |
| 2009/0159697 A1 | 6/2009 | Mullen et al. |
| 2009/0159698 A1 | 6/2009 | Mullen et al. |
| 2009/0159699 A1 | 6/2009 | Mullen et al. |
| 2009/0159701 A1 | 6/2009 | Mullen et al. |
| 2009/0159702 A1 | 6/2009 | Mullen |
| 2009/0159703 A1 | 6/2009 | Mullen et al. |
| 2009/0159704 A1 | 6/2009 | Mullen et al. |
| 2009/0159705 A1 | 6/2009 | Mullen et al. |
| 2009/0159709 A1 | 6/2009 | Mullen |
| 2009/0159710 A1 | 6/2009 | Mullen et al. |
| 2009/0159712 A1 | 6/2009 | Mullen et al. |
| 2009/0160617 A1 | 6/2009 | Mullen et al. |
| 2009/0242648 A1 | 10/2009 | Di Sirio et al. |
| 2009/0244858 A1 | 10/2009 | Di Sirio et al. |
| 2009/0253460 A1 | 10/2009 | Varone et al. |
| 2009/0255996 A1 | 10/2009 | Brown et al. |
| 2009/0290704 A1 | 11/2009 | Cimino |
| 2009/0303885 A1 | 12/2009 | Longo |
| 2009/0308921 A1 | 12/2009 | Mullen |
| 2011/0028184 A1 | 2/2011 | Cooper |
| 2011/0272471 A1 | 11/2011 | Mullen |
| 2011/0272472 A1 | 11/2011 | Mullen |
| 2011/0272473 A1 | 11/2011 | Mullen et al. |
| 2011/0272474 A1 | 11/2011 | Mullen et al. |
| 2011/0272475 A1 | 11/2011 | Mullen et al. |
| 2011/0272477 A1 | 11/2011 | Mullen et al. |
| 2011/0272478 A1 | 11/2011 | Mullen |
| 2011/0272480 A1 | 11/2011 | Mullen et al. |
| 2011/0272481 A1 | 11/2011 | Mullen et al. |
| 2011/0272482 A1 | 11/2011 | Mullen et al. |
| 2011/0276381 A1 | 11/2011 | Mullen et al. |
| 2011/0276416 A1 | 11/2011 | Mullen et al. |
| 2011/0276424 A1 | 11/2011 | Mullen |
| 2011/0276425 A1 | 11/2011 | Mullen |
| 2011/0278364 A1 | 11/2011 | Mullen et al. |
| 2011/0282753 A1 | 11/2011 | Mullen et al. |
| 2011/0284632 A1 | 11/2011 | Mullen et al. |
| 2011/0284640 A1 | 11/2011 | Mullen et al. |
| 2012/0028702 A1 | 2/2012 | Mullen et al. |
| 2012/0197708 A1 | 8/2012 | Mullen et al. |
| 2012/0209744 A1 | 8/2012 | Mullen et al. |
| 2012/0254037 A1 | 10/2012 | Mullen |
| 2012/0254038 A1 | 10/2012 | Mullen |
| 2012/0286037 A1 | 11/2012 | Mullen et al. |
| 2012/0286928 A1 | 11/2012 | Mullen et al. |
| 2012/0286936 A1 | 11/2012 | Mullen et al. |
| 2012/0290449 A1 | 11/2012 | Mullen et al. |
| 2012/0290472 A1 | 11/2012 | Mullen et al. |
| 2012/0318871 A1 | 12/2012 | Mullen et al. |
| 2013/0020396 A1 | 1/2013 | Mullen et al. |
| 2013/0282573 A1 | 10/2013 | Mullen et al. |
| 2013/0282575 A1 | 10/2013 | Mullen et al. |
| 2014/0054384 A1 | 2/2014 | Cloutier et al. |

FOREIGN PATENT DOCUMENTS

| | | |
|---|---|---|
| WO | WO0247019 | 6/2002 |
| WO | WO2006066322 | 6/2006 |
| WO | WO2006080929 | 8/2006 |
| WO | WO2006105092 | 10/2006 |
| WO | WO2006116772 | 11/2006 |
| WO | WO2008064403 | 6/2008 |
| WO | PCT/US11/25047 | 2/2011 |
| WO | PCT/US11/37041 | 5/2011 |
| WO | PCT/US11/45991 | 7/2011 |
| WO | PCT/US12/31919 | 4/2012 |
| WO | PCT/US12/31921 | 4/2012 |
| WO | PCT/US12/37237 | 5/2012 |
| WO | PCT/US13/26746 | 2/2013 |

OTHER PUBLICATIONS

U.S. Appl. No. 60/675,388, Poidomani et al.
The Bank Credit Card Business. Second Edition, American Bankers Association, Washington, D.C., 1996.
A Day in the Life of a Flux Reversal. http://www.phrack/org/issues.html?issue=37&id=6#article. As viewed on Apr. 12, 2010.
Dynamic Virtual Credit Card Numbers. http://homes.cerias.purdue.edu/~jtli/paper/fc07.pdf. As viewed on Apr. 12, 2010.
English translation of JP 05210770 A.

* cited by examiner

SYSTEMS AND METHODS FOR AUTOMATED ASSEMBLY OF DYNAMIC MAGNETIC STRIPE COMMUNICATIONS DEVICES

CROSS-REFERENCE TO RELATED APPLICATION

This application claims the benefit of U.S. Provisional Patent Application No. 61/597,105, titled "SYSTEMS AND METHODS FOR AUTOMATED ASSEMBLY OF DYNAMIC MAGNETIC STRIPE COMMUNICATIONS DEVICES," filed Feb. 9, 2012, which is hereby incorporated by reference herein in its entirety.

BACKGROUND OF THE INVENTION

This invention relates to powered cards and devices and related systems.

SUMMARY OF THE INVENTION

A card may include a dynamic magnetic communications device, which may take the form of a magnetic encoder or a magnetic emulator. A magnetic encoder, for example, may be utilized to modify information that is located on a magnetic medium, such that a magnetic stripe reader may then be utilized to read the modified magnetic information from the magnetic medium. A magnetic emulator, for example, may be provided to generate electromagnetic fields that directly communicate data to a read-head of a magnetic stripe reader. A magnetic emulator, for example, may communicate data serially to a read-head of the magnetic stripe reader. A magnetic emulator, for example, may communicate data in parallel to a read-head of the magnetic stripe reader. A magnetic emulator, for example, may generate one or more waveforms using one or more signal generators to communicate data via one or more communication channels to a read-head of the magnetic stripe reader.

All, or substantially all, of the front surface, as well as the rear surface, of a card may be implemented as a display (e.g., bi-stable, non bi-stable, LCD, or electrochromic display). Electrodes of a display may be coupled to one or more touch sensors, such that a display may be sensitive to touch (e.g., using a finger or a pointing device) and may be further sensitive to a location of the touch. The display may be sensitive, for example, to objects that come within a proximity of the display without actually touching the display.

A card may include a number of output devices to output dynamic information. For example, a card may include one or more RFIDs or IC chips to communicate to one or more RFID readers or IC chip readers, respectively. A card may include devices to receive information. For example, an RFID and IC chip may both receive information and communicate information to an RFID and IC chip reader, respectively. A device for receiving wireless information signals may be provided. A light sensing device or sound sensing device may be utilized to receive information wirelessly. A card may include a central processor that communicates data through one or more output devices simultaneously (e.g., an RFID, IC chip, and a dynamic magnetic stripe communications device). The central processor may receive information from one or more input devices simultaneously (e.g., an RFID, IC chip, dynamic magnetic stripe devices, light sensing device, and a sound sensing device). A processor may be coupled to surface contacts such that the processor may perform the processing capabilities of, for example, an EMV chip. The processor may be laminated over and not exposed such that such a processor is not exposed on the surface of the card.

A card may be provided with a button in which the activation of the button causes a code to be communicated through a dynamic magnetic stripe communications device (e.g., the subsequent time a read-head detector on the card detects a read-head). The code may be indicative of, for example, a merchant code or incentive code. The code may be received by the card via manual input (e.g., onto buttons of the card) or via a wireless transmission (e.g., via light, electromagnetic communications, sound, or other wireless signals). A code may be communicated from a webpage (e.g., via light and/or sound). A card may include a display such that a received code may be visually displayed to a user. In doing so, the user may be provided with a way to select, and use, the code.

A dynamic magnetic stripe communications device may include a magnetic emulator that comprises one or more inductors (e.g., one or more coils). Current may be provided through these coils to create electromagnetic fields that may be operable to communicate with the read-head of a magnetic stripe reader. One or more signal generators (e.g., one or more ramp generators and one or more signal shaping generators) may combine to generate one or more signals to fluctuate the amount of current traveling through the one or more coils. In so doing, one or more electromagnetic waveforms generated by the one or more coils may communicate one or more tracks of magnetic stripe data to a read-head of a magnetic stripe reader.

A card may, for example, be formed as a laminate structure of two or more layers. A card may, for example, include top and bottom layers of a plastic material (e.g., a polymer). Electronics package circuitry (e.g., one or more printed circuit boards, a dynamic magnetic stripe communications device, a battery, a display, a processor, and buttons) may be sandwiched between top and bottom layers of a laminate structure of a card. A material (e.g., a polyurethane-based or silicon-based substance) may be injected between top and bottom layers and cured (e.g., solidified) to form a card that has a flexible laminate structure.

In manufacturing multiple cards dedicated to particular functions, electronic sub-assemblies may be produced, whose functionality and reliability may be verified separately before final assembly. Once verified, one or more of the electronic sub-assemblies may be mechanically and/or electrically coupled together via, for example, epoxy or conductive tape to form, for example, an electronics assembly.

One or more cards or devices may be formed using an automated processing system where an electronics assembly may be encapsulated between layers of laminate. A series of lamination steps, for example, may be implemented along an automated conveyor system that may process one or more cards at a time (e.g., a set of 8 cards may be processed at one time). Each set of cards, for example, may be indexed along the automated conveyor system, such that each set of cards is processed differently depending upon the indexed position of the automated conveyor system.

An initial indexed position of the automated conveyor system may, for example, apply a continuous sheet of plastic (e.g., a sheet of polymer) along a length of a moving conveyor that may accommodate a set of cards. Such a sheet may, for example, eventually form a back side of each card. Accordingly, for example, a sheet of polymer may be applied to a conveyer, where a length of the sheet of polymer may be adequate to accommodate a set of electronics assemblies (e.g., a set of 8 electronics assemblies).

As the sheet of polymer travels through the automated conveyor system, a strip of damming material (e.g., vinyl material) may be applied to the sheet of polymer. One or more strips (e.g., two strips) of damming material may, for example, be applied to the sheet of polymer. Two strips of damming material may be applied, for example, so that each strip of damming material extends along a length of the sheet of polymer in parallel fashion.

Once damming strips are applied to the sheet of polymer, a material (e.g., a polyurethane-based or silicon-based substance) having properties of a liquid may be sprayed between the two damming strips. In so doing, the material may tend to flow in directions along the sheet of polymer that may be defined by the damming strips (e.g., liquid material may flow along a length of the sheet of polymer but may be prevented from flowing along a width of the sheet of polymer that is outside of the damming strips). Accordingly, for example, a liquid material may be sprayed between two parallel damming strips, where the liquid material is free to flow along a length of the sheet of polymer between the parallel damming strips, but the liquid is restrained from flowing outside of the parallel damming strips.

A subsequent indexed position of the automated conveyor system may, for example, allow electronic assemblies to be placed along the sheet of polymer between the parallel damming strips. Accordingly, for example, electronic assemblies may be placed on top of a liquid material along a length of the sheet of polymer between parallel damming strips. In so doing, the parallel damming strips may prevent the liquid material from spreading along a width of the sheet of polymer outside of an area defined by the parallel damming strips. A mechanical operation (e.g., a robotic mechanical operation) may, for example, be used to pick and place the electronic assemblies along the sheet of polymer.

As the continuous sheet of polymer continues to travel through the automated conveyor system, a second layer of material (e.g., a polyurethane-based or silicon-based substance) may be sprayed on top of the electronic assemblies. One or more spray heads may, for example, be used to distribute the material on top of the electronic assemblies at the same or different rates. Portions of the electronic assembly may require more or less material as compared to other portions of the electronic assembly due, for example, to a varying topography of the electronic assembly. Accordingly, for example, a lower flow rate may be established for one spray head and a higher flow rate may be established for another spray head. In so doing, for example, a need to provide varying amounts of material over the top of an electronic assembly depending, for example, upon a topography of the electronic assembly may be accommodated.

A second sheet of plastic (e.g., a sheet of polymer) may be placed over the top of the electronic assemblies. A roller mechanism of the automated conveyor system may, for example, press the electronic assemblies and liquid material between the two sheets of polymer while the sheets of polymer index along the conveyor. Accordingly, for example, a line of pressure extending along a width of the sheet of polymer, as may be generated by the roller, may squeeze excess liquid material from between the parallel damming strips along a length of the polymer sheets. In so doing, a substantially uniform layer of liquid material may exist on top of, and on the bottom of, the electronic assembly that may be sandwiched between the two sheets of polymer. In addition, the roller mechanism may force out any trapped air that may exist between the two sheets of polymer.

The automated conveyor system may, for example, index through a curing station. The curing station may, for example, include a clamp mechanism that is translucent or transparent (e.g., a clamp mechanism made from glass). The clamp mechanism may, for example, apply pressure to both the bottom sheet of polymer and the top sheet of polymer that is centered about the electronics assembly. Accordingly, the two sheets of polymer may be pressed onto the electronics assembly to create a uniform compressed thickness between approximately 0.025 inches and 0.33 inches (e.g., approximately 0.029 inches).

The curing station may, for example, apply a curing process to the pressed assembly to cure the assembly while the assembly is being pressed by the clamp. For example, a liquid material (e.g., a polyurethane-based or silicon-based substance) within the pressed assembly may be a substance that changes its physical state (e.g., changes from a liquid substance to a solid substance) when cured by one or more conditions (e.g., air, heat, pressure, light, and/or chemicals) for a period of time. Accordingly, for example, light (e.g., ultraviolet light) may be passed through the transparent clamp to cure the assembly to a hardened state.

The automated conveyor system may, for example, index through a singulation station. For example, one or more cured assemblies (e.g., 8 cured assemblies) may be indexed through the automated conveyor system and singulated from the trailing assemblies. Accordingly, for example, a product of the automated conveyer system may be a collection of one or more cards or devices laminated between two sheets of laminate that have been fully cured to a hardened yet flexible state.

BRIEF DESCRIPTION OF THE DRAWINGS

The principles and advantages of the present invention can be more clearly understood from the following detailed description considered in conjunction with the following drawings, in which the same reference numerals denote the same structural elements throughout, and in which.

DETAILED DESCRIPTION OF THE INVENTION

Figure 1:
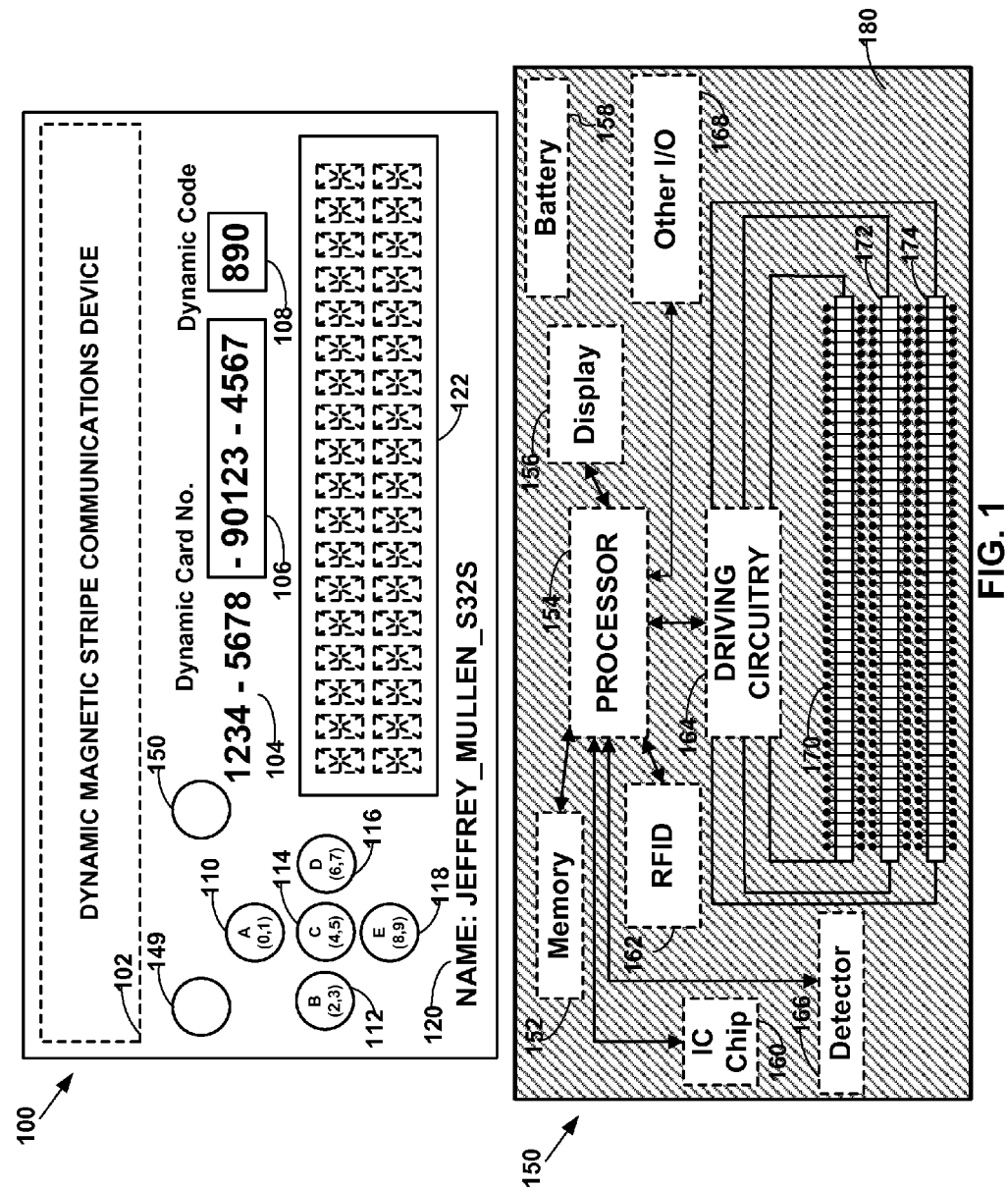
FIG. 1 is an illustration of a card constructed in accordance with the principles of the present invention.

FIG. 1 shows card 100 that may include, for example, a dynamic number that may be entirely, or partially, displayed using a display (e.g., display 106). A dynamic number may include a permanent portion such as, for example, permanent portion 104 and a dynamic portion such as, for example, dynamic portion 106. Card 100 may include a dynamic number having permanent portion 104 and permanent portion 104 may be incorporated on card 100 so as to be visible to an observer of card 100. For example, labeling techniques, such as printing, embossing, laser etching, etc., may be utilized to visibly implement permanent portion 104.

Card 100 may include a second dynamic number that may be entirely, or partially, displayed via a second display (e.g., display 108). Display 108 may be utilized, for example, to display a dynamic code such as a dynamic security code. Card 100 may also include third display 122 that may be used to display graphical information, such as logos and barcodes. Third display 122 may also be utilized to display multiple rows and/or columns of textual and/or graphical information.

Persons skilled in the art will appreciate that any one or more of displays 106, 108, and/or 122 may be implemented as a bi-stable display. For example, information provided on displays 106, 108, and/or 122 may be stable in at least two different states (e.g., a powered-on state and a powered-off state). Any one or more of displays 106, 108, and/or 122 may be implemented as a non-bi-stable display. For example, the display is stable in response to operational power that is applied to the non-bi-stable display. Other display types, such as LCD or electrochromic, may be provided as well.

Other permanent information, such as permanent information 120, may be included within card 100, which may include user specific information, such as the cardholder's name or username. Permanent information 120 may, for example, include information that is specific to card 100 (e.g., a card issue date and/or a card expiration date). Information 120 may represent, for example, information that includes information that is both specific to the cardholder, as well as information that is specific to card 100.

Card 100 may accept user input data via any one or more data input devices, such as buttons 110-118. Buttons 110-118 may be included to accept data entry through mechanical distortion, contact, or proximity. Buttons 110-118 may be responsive to, for example, induced changes and/or deviations in light intensity, pressure magnitude, or electric and/or magnetic field strength. Such information exchange may then be determined and processed by a processor of card 100 as data input.

For example, one or more buttons 110-118 may be activated in response to indicia displayed on a display (e.g., display 122) that may be associated with corresponding information (e.g., payment account information) that may be stored within a memory of card 100. Alternately, for example, a single button (e.g., button 110) may be pressed multiple times to sequentially display data that may be associated with information (e.g., information associated with multiple payment accounts).

Card 100 may include button 149. Button 149 may be used, for example, to communicate a magnetic waveform via dynamic magnetic stripe communications device 102 indicative of a user's desire to communicate a single track of magnetic stripe information. Persons skilled in the art will appreciate that pressing a button (e.g., button 149) may activate dynamic magnetic stripe communications device 102 and may cause information to be communicated via dynamic magnetic stripe communications device 102 when an associated read-head detector detects the presence of a read-head of a magnetic stripe reader.

Button 150 may be utilized to communicate (e.g., after button 150 is pressed and after a read-head detects a read-head of a reader) information indicative of a user selection (e.g., to communicate two tracks of magnetic stripe data). For example, data associated with a user's payment account may be extracted from a memory location within card 100 and may be converted to an analog waveform (e.g., an F2F encoded waveform). In so doing, a waveform representative of two tracks of magnetic stripe information may be communicated to a read head of a magnetic stripe reader.

Persons skilled in the art will appreciate that a physical payment card may be provided as a virtual payment card on a display of any device, such as a mobile telephonic device or personal computing device. A button on a physical payment card may be a button on any device, such as a mobile telephonic device or personal computing device. Accordingly, for example, a device (e.g., a cell phone) may receive manual input from a manual user interface (e.g., a virtual button on a capacitive touch screen) and communicate information indicative of the selection (e.g., a single track of magnetic stripe data) to another device (e.g., a payment terminal such as a card reader) via a communications device (e.g., an RF-based communications device).

FIG. 1 shows architecture 150, which may include one or more processors 154. Processor 154 may be configured to utilize external memory 152, internal memory to processor 154, or a combination of external memory and internal memory for dynamically storing information, such as executable machine language, related dynamic machine data, user input data values, or any other type of information (e.g., payment account data).

Processor 154 may, for example, retrieve data stored within memory 152. Driving circuitry 164 may, for example, include one or more signal generators (e.g., ramp generators and signal shaping generators) that may receive the data and may convert the data to one or more signals (e.g., one or more current signals). One or more of the current signals may be used to drive one or more electromagnetic field generators 170-174 to generate one or more electromagnetic signals that may be received by a magnetic stripe reader.

One or more of the components shown in architecture 150 may be configured to transmit information to processor 154 and/or may be configured to receive information as transmitted by processor 154. For example, one or more displays 156 may be coupled to receive data from processor 154. The data received from processor 154 may include, for example, at least a portion of dynamic numbers and/or dynamic codes. The data to be displayed on the display may be displayed on one or more displays 156.

One or more displays 156 may be, for example, touch sensitive and/or proximity sensitive. For example, objects such as fingers, pointing devices, etc., may be brought into contact with displays 156, or into proximity with displays 156. Detection of object proximity or object contact with displays 156 may be effective to perform any type of function (e.g., transmit data to processor 154). Displays 156 may have multiple locations that are able to be determined as being touched, or determined as being in proximity to an object.

Input and/or output devices may be implemented on architecture 150. For example, integrated circuit (IC) chip 160 (e.g., an EMV chip) may be included within architecture 150, that may communicate information to a chip reader (e.g., an EMV chip reader). Radio frequency identification (RFID) module 162 may be included within architecture 150 to enable the exchange of information between an RFID reader/writer and a card (e.g., card 100 of FIG. 1).

Other input and/or output devices 168 may be included within architecture 150, for example, to provide any number of input and/or output capabilities on a card (e.g., card 100 of FIG. 1). For example, other input and/or output devices 168 may include an audio device capable of receiving and/or transmitting audible information. Other input and/or output devices 168 may include a Wi-Fi device, such that a card (e.g., card 100 of FIG. 1) may access an open network (e.g., the Internet).

Other input and/or output devices 168 may include a device that exchanges analog and/or digital data using a visible data carrier. For example, light pulses may be received by other input and/or output devices 168 and may be construed by processor 154 as data indicative of information that may be stored in memory (e.g., payment account data stored within memory 152). Other input and/or output devices 168 may include a device, for example, that is sensitive to a non-visible data carrier, such as an infrared data carrier or electromagnetic data carrier.

Persons skilled in the art will appreciate that a card (e.g. card 100 of FIG. 1) may, for example, be a self-contained device that derives its own operational power from one or more batteries 158. Furthermore, one or more batteries 158 may be included, for example, to provide operational power to a card for a period of time (e.g., a period between 2 and 5 years such as approximately 2 years). One or more batteries 158 may be included, for example, as rechargeable batteries.

A dynamic magnetic stripe communications device may be included on a card (e.g., card 100 of FIG. 1) to communicate information to, for example, a read-head of a magnetic stripe reader via, for example, electromagnetic signals. For example, electromagnetic field generators 170-174 may be included to communicate one or more tracks of electromagnetic data to read-heads of a magnetic stripe reader. Electromagnetic field generators 170-174 may include, for example, a series of electromagnetic elements, where each electromagnetic element may be implemented as a coil wrapped around one or more materials (e.g., a magnetic material and/or a non-magnetic material). Additional materials may be placed outside the coil (e.g., a magnetic material and/or a non-magnetic material).

Electrical excitation by driving circuitry 164 of one or more coils of one or more electromagnetic field generators 170-174 may be effective to generate one or more electromagnetic waveforms. The one or more electromagnetic waveforms may be utilized to communicate information from a card (e.g., card 100 of FIG. 1) to one or more read-heads of a magnetic stripe reader.

Timing aspects of information exchange between a card and the various input and/or output devices implemented on the card may be determined by a processor of the card. Detector 166 may be utilized, for example, to sense the proximity and/or actual contact, of an external device, which in turn, may trigger the initiation of a communication sequence. The sensed presence and/or touch of the external device may then be communicated to a controller (e.g., processor 154), which in turn may direct the exchange of information between a card (e.g., card 100 of FIG. 1) and the external device. The sensed presence and/or touch of the external device may be effective to, for example, determine the type of device or object detected.

For example, the detection may include the detection of, for example, a read-head of a magnetic stripe reader. In response, driving circuitry 164 may activate one or more electromagnetic field generators 170-174 to initiate a communications sequence with, for example, one or more read-heads of a magnetic stripe reader.

Detector 166 may, for example, detect a direction and velocity of movement of a read-head of a magnetic stripe reader and report such detected direction and velocity to processor 154. Processor 154 may, in turn, report the direction and velocity of movement to driving circuitry 164, which may in turn generate one or more magnetic waveforms that are compatible with the detected direction and velocity of movement of the detected read-head of the magnetic stripe reader.

Persons skilled in the art will appreciate that processor 154 may provide user-specific and/or card-specific information through utilization of any one or more buttons (e.g., buttons 110-118 of card 100 of FIG. 1), RFID 162, IC chip 160, electromagnetic field generators 170-174, and other input and/or output devices 168.

A card (e.g., card 100 of FIG. 1) may be assembled as a combination of two or more circuit boards. A dynamic magnetic stripe communications device may, for example, be fabricated and assembled on a first circuit board while a second circuit board may be fabricated and assembled having other circuitry. For example, a card's processor, dynamic magnetic communications device driver circuitry, user interfaces, read-head detectors, light emitting devices, displays, batteries, and any other type of sensor, device, or associated circuitry may be fabricated on one or more other circuit boards.

Each circuit board may be mechanically and/or electrically coupled together via, for example, epoxy or conductive tape to form, for example, an electronics assembly. Multiple of these electronics assemblies may be picked and placed (e.g., picked and placed automatically by a robotic arm) onto a conveyor. The conveyor may, for example, be driving a sheet of polymer (e.g., sheet 180) to form one side (e.g., the reverse side) of a card (e.g., card 100 of FIG. 1). A second sheet of polymer (not shown) may form a second side (e.g., the obverse side) of a card (e.g., card 100 of FIG. 1).

Figure 2:
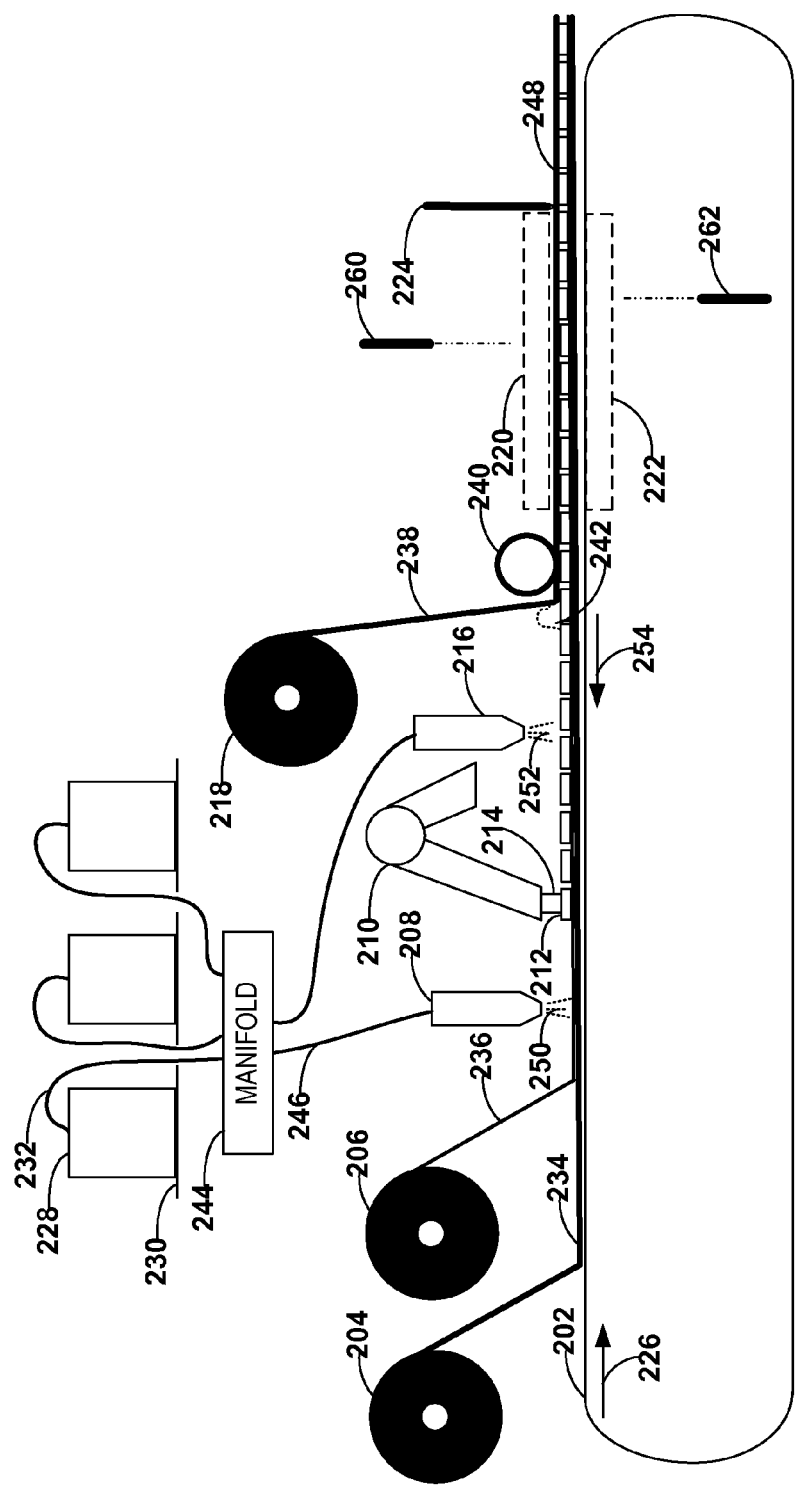
FIG. 2 is an illustration of an automated conveyor system constructed in accordance with the principles of the present invention.

FIG. 2 shows automated conveyor system 200, which may include conveyor 202, reel 204, reel 206, sprayer 208, robotic arm 210, electronic assemblies 212, sprayer 216, reel 218, roller 240, clamps 220 and 222, sheer 224, canisters 228, scales 230, curing devices 260 and 262, and manifold 244. Automated conveyor system 200 includes all processing stations that may be required to produce a set of cards or devices that may include electronics assemblies that may be laminated between sheets of laminate material (e.g., sheets of a polymer such as PVC). Each set of cards or devices, after having been produced in sets of one or more cards or devices (e.g., a set of 8 cards or devices), may be singulated by sheer 224 for further processing.

Conveyor 202 may provide mobility as may be required by the various processing stations of automated conveyor system 200 in forward (e.g., direction 226) and/or reverse (e.g., direction 254) directions. A first processing station of automated conveyor system 200 may include reel 204, which may apply a sheet of continuous plastic (e.g., continuous sheet of PVC 234) that may be approximately between 0.003 inches and 0.007 inches (e.g., approximately 0.005 inches) thick onto conveyor 202. A width of PVC sheet 234 as applied by reel 204 may be between approximately 5 inches and 7 inches (e.g., approximately 6 inches) wide.

A second processing station of automated conveyor system 200 may include one or more reels 206, which may apply at least one (e.g., two) continuous strips of damming material 236 onto PVC sheet 234. The damming material may, for example, be a vinyl material between approximately 0.4 inches and 0.6 inches (e.g., approximately 0.5 inches) wide and between approximately 0.009 inches and 0.011 inches (e.g., approximately 0.010 inches) thick. A first strip of damming material may, for example, be placed along one side of PVC sheet 234 between approximately 0.4 inches and 0.6 inches (e.g., approximately 0.5 inches) from one side of PVC sheet 234. A second strip of damming material may, for example, be placed along the other side of PVC sheet 234 between approximately 0.4 inches and 0.6 inches (e.g., approximately 0.5 inches) from the other side of PVC sheet 234. The damming material may include an adhesive (e.g., a vinyl adhesive) on one side of the damming material. The damming material may include a backing strip (not shown) to protect the adhesive. The backing strip may be peeled away (e.g., by another processing station not shown) prior to applying damming material 236 to PVC sheet 234.

Sprayer 208 may apply a layer of material 250 (e.g., a material formed from one or more polyurethane-based or silicon-based substances) onto PVC sheet 234 between damming strips 236. Sprayed material 250 may be a substance that changes its physical state (e.g., changes from a liquid substance to a solid substance) when cured by one or more conditions (e.g., air, heat, pressure, light, or chemicals) for a period of time. One or more canisters 228 may contain such material 250. Hoses 232 and 246 may deliver material 250 from canisters 228 and manifold 244, respectively, to sprayers 208 and 216, respectively, as needed. Material 250 may be cured by light (e.g., UV light), which may require that canisters 228 and hoses 232, 246 be protected from UV transmissions. In so doing, material 250 may remain in an uncured state while being delivered from canisters 228 and hoses 232, 246 to sprayers 208 and 216.

Canisters 228 may, for example, rest upon scales 230, which may continuously measure a weight of canisters 228. Accordingly, for example, an alarm may be delivered (e.g., delivered audibly or visibly) to alert an operator to replace an empty canister with a filled canister. Manifold 244 may retrieve material from a canister until that canister is depleted and then retrieve material from a second canister until that canister is depleted and so on. An operator monitoring automated conveyor system 200 may observe an alarm reporting a depleted canister and replace that depleted canister as necessary.

Electronic assemblies 212 may be placed (e.g., automatically picked and placed by robotic arm 210) onto PVC sheet 234 between damming strips 236. Robotic arm 210 may, for example, employ a camera which may enable computer-vision-assisted placement of electronic assemblies 212. Alternately, for example, robotic arm 210 may not employ vision, but may instead use a coarse method of placement (e.g., mechanical measurements of robotic arm displacement) of electronic assemblies 212 onto PVC sheet 234. Robotic arm 210 may, for example, include fingers 214 (e.g., pneumatic fingers 214) that may create suction to pick electronic assemblies 212 from a bin of electronic assemblies (not shown) and may release such suction once robotic arm 210 has placed electronic assemblies 212 onto PVC sheet 234.

Sprayer 216 may apply another layer of material 252 (e.g., a material formed from one or more polyurethane-based or silicon-based substances) onto the picked and placed electronic assemblies 212. Sprayed material 252 may be a substance that changes its physical state (e.g., changes from a liquid substance to a solid substance) when cured by one or more conditions (e.g., air, heat, pressure, light, or chemicals) for a period of time.

Sprayer 216 may include two or more spray heads (e.g., three spray heads) that may spray variable amounts of material 252 onto electronic assemblies 212. A first spray head may, for example, spray an increased amount of material 252 onto an area of electronic assemblies 212 that may exhibit relatively low topography, which may require an extra amount of material 252. A second spray head may, for example, spray a decreased amount of material 252 onto an area of electronic assemblies 212 that may exhibit relatively high topography, which may require a lesser amount of material 252. A third spray head may, for example, be employed to fill yet a third topographic region of electronic assemblies 212 with material 252.

An additional processing station of automated conveyor system 200 may include reel 218, which may apply a sheet of plastic (e.g., sheet of PVC 238) that may be approximately between 0.003 inches and 0.007 inches (e.g., approximately 0.005 inches) thick onto electronic assemblies 212. A width of PVC sheet 238 as applied by reel 218 may be between approximately 5 inches and 7 inches (e.g., approximately 6 inches) wide.

Roller 240 may, for example, be employed to press PVC sheets 234 and 238 against electronic assemblies 212 as conveyor 202 indexes in direction 226. In addition, roller 240 may create a substantially uniform thickness between approximately 0.025 inches and 0.033 inches (e.g., approximately 0.029 inches) for completed card or device sets 248.

By pressing PVC sheets 234 and 238 against electronic assemblies 212, excess material 242 may be pressed away from card or device sets 248 in direction 254 as conveyor 202 indexes in direction 226. Accordingly, for example, excess material 242 may reflow over electronic assemblies 212 as conveyor indexes in direction 226. In so doing, re-distribution of material 242 may promote greater uniformity of material thickness between PVC sheets 234 and 238. In addition, excess air trapped between PVC sheets 234 and 238 may be forced away from card or device sets 248.

Conveyor 202 may advance card or devices sets 248 towards clamp 220 and 222 in direction 226. Clamps 220 and 222 may, for example, be comprised of a transparent or translucent material (e.g., glass). Accordingly, for example, while clamps 220 and 222 are further compressing card or devices sets 248 (e.g., via pneumatic compression), curing devices 260 and 262 (e.g., UV lamps) may be separately and individually controlled to cure the top and bottom portions of card or device sets 248 simultaneously. Curing devices 260 and 262 may, for example, emit UV light at wavelengths between approximately 520 nm and 640 nm (e.g., approximately 560-600 nm).

Conveyor 202 may advance card or device sets 248 towards sheer 224 for singulation. One or more cards or devices (e.g., 8 cards or devices) may exist in a single set 248, which may then be singulated by sheer 224 for further processing. For example, a set of eight cards or devices may be singulated into single cards or devices and forwarded onto a personalization station.

A personalization station may include multiple modules (e.g., multiple programming modules or multiple diagnostic modules) such that cards or devices may be personalized and/or diagnosed utilizing the personalization station. For example, a personalization station may include one or more modules for embossing a card or device, modules for printing indicia on a card or device, modules for writing to a static magnetic stripe of a card or device, modules for reading from a static magnetic stripe of a card or device, modules for reading information from a magnetic emulator of a card or device, modules for writing information to a magnetic emulator of a card or device, modules for reading and/or writing information to an IC chip (e.g., EMV chip) of a card or device, modules for reading and/or writing information to an RFID tag of a card or device, modules for laser engraving to a card or device, modules for flex-testing a card or device, modules for testing physical features of a card or device (e.g., thickness of a card or device), modules for placing holograms onto a card or device, modules for placing protective coatings on a card or device, modules for placing information onto an exterior surface of the card or device that corresponds to data contained within a memory of the card or device, modules for retrieving diagnostic data from a card or device (e.g., battery voltage magnitude), and modules for placing a material operable to receive an ink-based signature/mark on a card or device.

Figure 3:
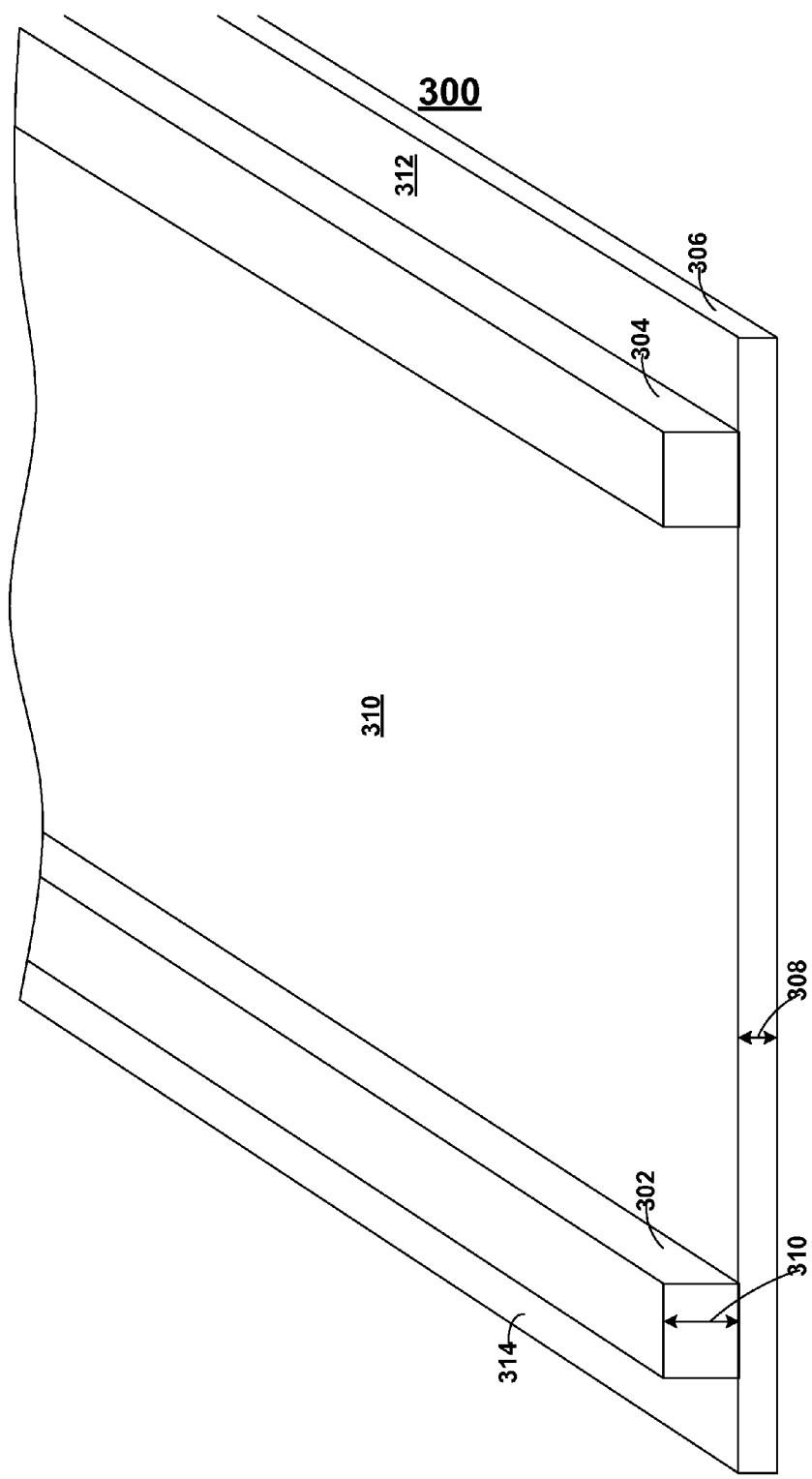
FIG. 3 is an illustration of a sub-assembly constructed in accordance with the principles of the present invention.

FIG. 3 shows sub-assembly 300 produced at an initial processing station of an automated conveyor system that may include a bottom layer of plastic (e.g., PVC layer 306) and two damming strips (e.g., vinyl strips 302 and 304). Persons skilled in the art will appreciate that a sheet of PVC produced by an automated conveyor system may be a continuous sheet of PVC that may undergo a number of processing steps. Persons skilled in the art will further appreciate that once a minimum number of processing steps have been completed on the substrate, then portions may be singulated from the continuous substrate for further processing.

PVC layer 306 may, for example, form the first layer of a build up, where portions 312 and 314 are devoid of materials or components. Thickness 308 of layer 306 may be between approximately 0.003 and 0.007 inches (e.g., approximately 0.005 inches). Damming strips 302 and 304 may, for example, be adhered to PVC layer 306 via an adhesive (e.g., a vinyl adhesive) such that approximately half an inch of distance exists between each edge of PVC layer 306 and damming strips 302 and 304 in regions 314 and 312, respectively. Damming strips 302 and 304 may be applied to PVC layer 306, for example, to contain materials and components within region 310 while excluding materials and components from regions 312 and 314. Region 310 may, for example, be approximately 3 inches to 5 inches (e.g., approximately 4 inches) wide between damming strips 302 and 304.

Figure 4:
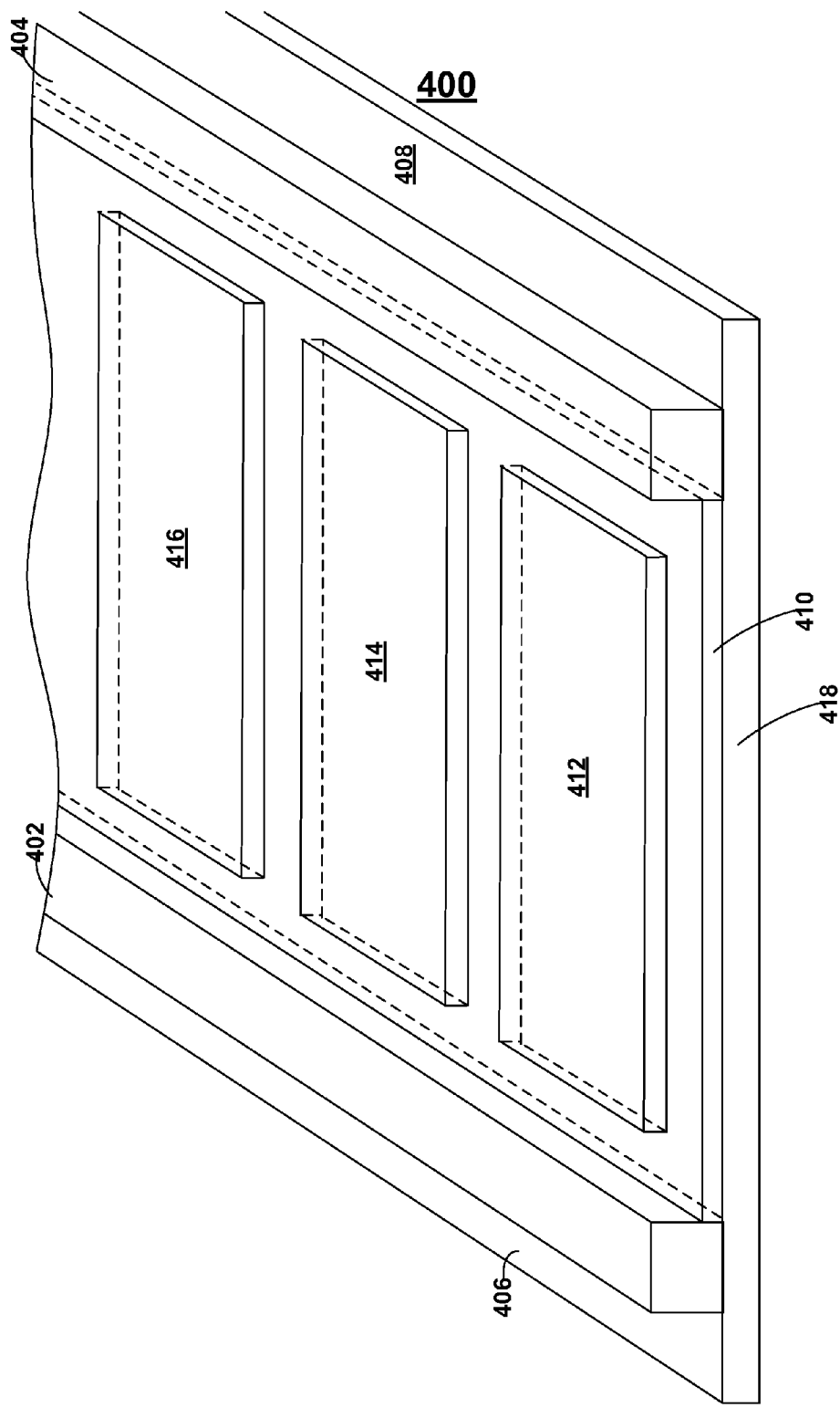
FIG. 4 is an illustration of a sub-assembly constructed in accordance with the principles of the present invention.

FIG. 4 shows sub-assembly 400 produced at a subsequent processing station of an automated conveyor system that may include components from previous processing steps, such as a bottom layer of plastic (e.g., PVC layer 418) and two damming strips (e.g., vinyl strips 402 and 404). Layer 410 may be applied as a sprayed liquid layer that may be a material formed from one or more polyurethane-based or silicon-based substances. A thickness of layer 410 may be between approximately 0.001 inch and 0.002 inches (e.g., approximately 0.0015 inches) thick. Damming strips 402 and 404 may, for example, contain layer 410 within a middle region of layer 418 while layer 410 remains uncured (e.g., in a liquid state).

Electronic assemblies 412, 414 and 416 may, for example, be comprised of various electrical and mechanical components, printed circuit boards, batteries, processors, dynamic magnetic stripe communications devices, buttons, detectors, input devices, output devices and the like. Each electronic assembly 412, 414 and 416 may, for example, be pre-manufactured and pre-tested and retrieved from a bin of electronic assemblies (not shown) by a robotic arm of the automated conveyor system.

Figure 5:
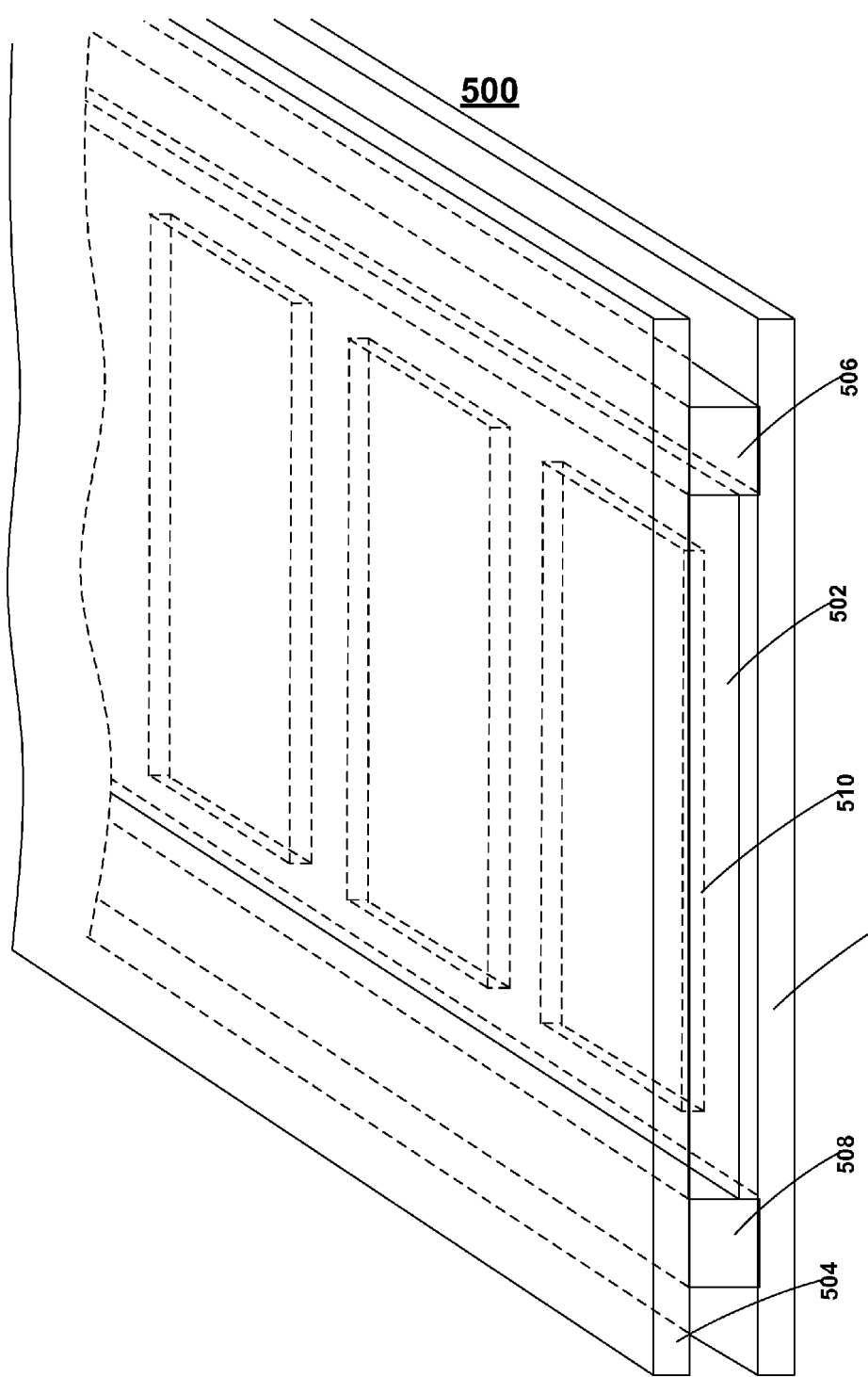
FIG. 5 is a sub-assembly constructed in accordance with the principles of the present invention.

FIG. 5 shows sub-assembly 500 produced at a subsequent processing station of an automated conveyor system that may include components from previous processing steps, as well as a top layer of plastic (e.g., PVC layer 504). Layer 502 may be applied as a sprayed liquid layer that may be a material formed from one or more polyurethane-based or silicon-based substances. A thickness of layer 502 may be variable across the width of layer 512 between damming strips 506 and 508. For example, electronic assemblies may have varying topographies. Accordingly, for example, a thickness of layer 502 that exists over a higher topographical region of electronic assembly 510 may be thinner than a thickness of layer 502 that exists over a lower topographical region of electronic assembly 510.

As layer 504 is applied, a roller (not shown) may press layer 504 against electronic assemblies 510 and damming strips 506, 508 as sub-assembly 500 advances through an automated conveyor system. In so doing, for example, layer 502 may fill in gaps that may exist between damming strips 506 and 508 to remove any air that may be trapped there between. The liquid material existing between layers 504 and 512 and between damming strips 506 and 508 may, for example, be cured by exposure to one or more environmental changes (e.g., air, heat, or light) for a period of time. In so doing, a portion of sub-assembly 500 may be cured (e.g., hardened) and separated from a remaining portion of sub-assembly 500 that is not cured. Once separated, the cured portion of sub-assembly 500 may be further processed as required.

Figure 6:
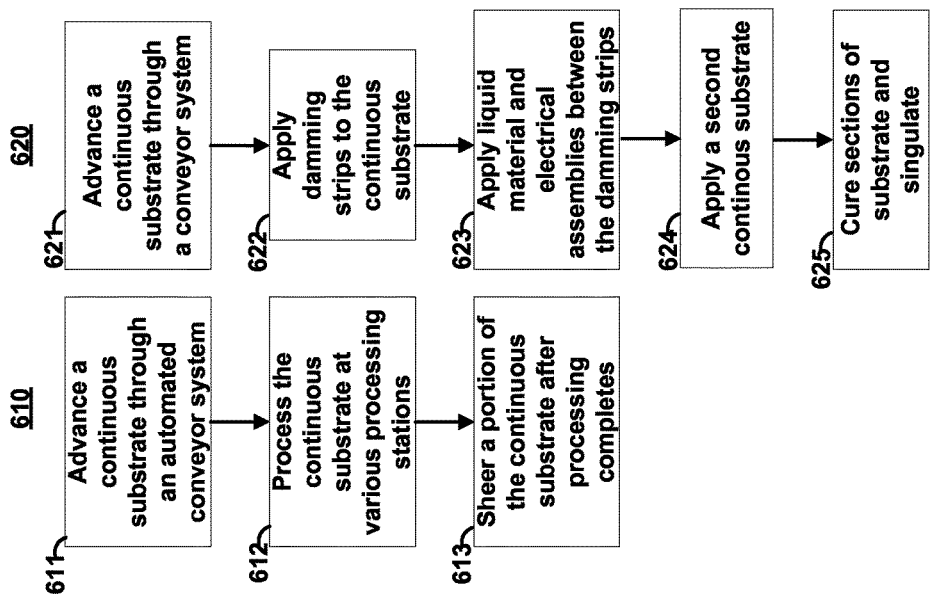
FIG. 6 is an illustration of a process flow constructed in accordance with the principles of the present invention.

A flow diagram of process sequences is shown in FIG. 6. Step 611 of sequence 610 may include, for example, include advancing a continuous sheet of plastic through an automated conveyor system. The sheet of plastic material (e.g., a sheet of polymer or PVC material) may be distributed to a conveyor via a spool. The PVC material may be fed to the conveyor via a guide roller system to maintain a flat and consistent position of the PVC material on the conveyor.

In step 612, while the PVC is continuously fed through the automated conveyor system from a spool of PVC material, processing occurs on the continuous sheet of PVC at various processing stations. For example, a processing station may apply one or more strips of damming material (e.g., two strips of damming material) onto the continuous sheet of PVC. A subsequent processing station may apply a liquid material between the damming strips, where the liquid material may be formed from one or more polyurethane-based or silicon-based substances.

A robotic arm may, for example, pick and place electronic assemblies from a bin of pre-manufactured and pre-tested electronic assemblies onto the continuous sheet of PVC between the damming strips and on top of the layer of liquid material. An additional spray station may apply additional liquid material on top of the electronic assemblies to fill air gaps that may exist. A continuous sheet of PVC may be applied on top of the electronic assemblies by a subsequent processing station. A roller station may compress the two continuous sheets of PVC to form an assembly having a substantially uniform thickness while the assembly is indexed through the automated conveyor system. As the assembly is compressed, excess liquid material may be evacuated while any trapped air that may exist within the assembly may also be evacuated from the assembly.

A clamping station may further compress the assembly. Such a clamping station may, for example, include transparent or translucent plates (e.g., glass plates) that may clamp the assembly while lamps (e.g., UV lamps) manipulate UV transmissions through the glass plates to cure the liquid material within the assembly. Such an assembly may include one or more cards or devices that when cured may advance to a sheering station. Such a sheering station may singulate the cured set of card or devices from the continuous sheet of substrate for further processing.

Step 621 of sequence 620 may include, for example, applying a continuous sheet of material (e.g., PVC material) as a continuous substrate onto a conveyor. The PVC material may be provided from a spool of PVC material that unwinds as the conveyor advances. Other spools of material may, for example, provide containment strips (e.g., two containment strips) onto the PVC material as the conveyor advances (e.g., as in step 622). Liquid material and electronic assemblies may be applied between the containment strips on top of the PVC sheet (e.g., as in step 623), such that the containment strips control a flow of the liquid material as well as an alignment of the electronic assemblies. A robotic arm may, for example, pick and place the electronic assemblies onto the PVC sheet. An additional PVC sheet may be applied on top of the electronic assemblies to form a lamination layer that extends continuously as the conveyor advances (e.g., as in step 624).

Portions of the two layers of PVC, electronic assemblies, and liquid material may be pressed and cured to form a section of completed cards or devices (e.g., as in step 625). The completed section may contain a number (e.g., 8) of completed cards or devices that may be singulated by a sheer station for further processing.

Persons skilled in the art will appreciate that the present invention is not limited to only the embodiments described. Instead, the present invention more generally involves dynamic information and the exchange thereof. Persons skilled in the art will also appreciate that the apparatus of the present invention may be implemented in other ways than those described herein. All such modifications are within the scope of the present invention, which is limited only by the claims that follow.

What is claimed is:

1. A method comprising:
   extending a portion of a first continuous sheet of plastic onto a moving conveyor;
   robotically placing an electronic assembly onto said portion of said first continuous sheet of plastic;
   applying a first material onto said electronic assembly;
   extending a portion of a second continuous sheet of plastic over said electronic assembly;
   curing at least a portion of said first material applied onto said electronic assembly;
   applying a plurality of strips of damming material lengthwise, in parallel, on said portion of said first continuous sheet of plastic; and
   applying a second material between at least two of said strips.

2. The method of claim 1, further comprising:
   moving, by said moving conveyor, said electronic assembly to a plurality of indexed positions.

3. The method of claim 1, further comprising:
   moving, by said moving conveyor, a plurality of electronic assemblies to a plurality of indexed positions.

4. The method of claim 1, further comprising:
   moving, by said moving conveyor, eight electronic assemblies to a plurality of indexed positions.

5. The method of claim 1,
   wherein said applying a second material between at least two of said strips includes spraying a second liquid material between at least two of said strips.

6. The method of claim 1,
   wherein said applying a second material between at least two of said strips includes spraying a second liquid material between at least two of said strips, and
   wherein said applying a first material onto said electronic assembly includes spraying a first liquid material onto said electronic assembly.

7. The method of claim 1, further comprising:
   pressing, by a roller, said portion of said first continuous sheet of plastic, said electronic assembly, said first material applied onto said electronic assembly, and said portion of said second continuous sheet of plastic.

8. The method of claim 1, further comprising:
   clamping said portion of said first continuous sheet of plastic and said portion of said second continuous sheet of plastic with a transparent clamp mechanism.

9. The method of claim 1, further comprising:
   clamping said portion of said first continuous sheet of plastic and said portion of said second continuous sheet of plastic with a translucent clamp mechanism.

10. The method of claim 1, further comprising:
    clamping said portion of said first continuous sheet of plastic and said portion of said second continuous sheet of plastic onto said electronic assembly to create a compressed thickness of approximately 0.029 inches.

11. The method of claim 1, further comprising:
    clamping said portion of said first continuous sheet of plastic and said portion of said second continuous sheet of plastic onto said electronic assembly,
    wherein said curing is performed during said clamping.

12. The method of claim 1, further comprising:
    clamping said portion of said first continuous sheet of plastic and said portion of said second continuous sheet of plastic onto said electronic assembly with a translucent clamping mechanism,
    wherein said curing includes passing ultraviolet light through said clamping mechanism.

13. The method of claim 1, further comprising:
    clamping said portion of said first continuous sheet of plastic and said portion of said second continuous sheet of plastic onto said electronic assembly with a transparent clamping mechanism,
    wherein said curing includes passing ultraviolet light through said clamping mechanism.

14. The method of claim 1, further comprising:
    peeling away a backing strip from one of the plurality of strips of damming material prior to said applying a plurality of strips of damming material.

15. A method comprising:
    extending a portion of a first continuous sheet of plastic onto a moving conveyor;
    robotically placing an electronic assembly onto said portion of said first continuous sheet of plastic;
    applying a first material onto said electronic assembly;
    extending a portion of a second continuous sheet of plastic over said electronic assembly;
    curing at least a portion of said first material applied onto said electronic assembly;
    applying a plurality of strips of damming material on said portion of said first continuous sheet of plastic; and
    applying a second material between at least two of said strips,
    wherein said robotically placing includes placing said electronic assembly between said at least two strips after said applying said second material between at least two of said strips.

16. The method of claim 15,
    wherein said applying a second material between at least two of said strips includes applying a liquid material between at least two of said strips, and
    wherein said robotically placing includes placing said electronic assembly on said liquid material.

17. The method of claim 15,
    wherein said applying a second material between at least two of said strips includes applying a liquid material between at least two of said strips, wherein said robotically placing includes placing said electronic assembly on said liquid material, and wherein said applying a first material onto said electronic assembly occurs after said applying a liquid material between at least two strips and before said extending a portion of a second continuous sheet of plastic over said electronic assembly.

18. A method comprising:

extending a portion of a first continuous sheet of plastic onto a moving conveyor;

robotically placing an electronic assembly onto said portion of said first continuous sheet of plastic;

applying a material onto said electronic assembly;

extending a portion of a second continuous sheet of plastic over said electronic assembly;

curing at least a portion of said material; and applying a plurality of strips of damming material lengthwise, in parallel, on said portion of said first continuous sheet of plastic.

19. The method of claim 18, further comprising:

moving, by said moving conveyor, one or more electronic assemblies to one or more indexed positions.

20. The method of claim 18, further comprising:

spraying a liquid material between at least two of said strips.

21. The method of claim 18, further comprising:

spraying a first liquid material between at least two of said strips, wherein said applying a material onto said electronic assembly includes spraying a second liquid material onto said electronic assembly.

22. The method of claim 18, further comprising:

applying a second material between at least two of said strips, wherein said robotically placing includes placing said electronic assembly between said at least two strips after said applying a second material between at least two of said strips.

23. The method of claim 18, further comprising:

applying a liquid material between at least two of said strips, wherein said robotically placing includes placing said electronic assembly on said liquid material.

24. The method of claim 18, further comprising:

applying a liquid material between at least two of said strips, wherein said robotically placing includes placing said electronic assembly on said liquid material, and wherein said applying a material onto said electronic assembly occurs after said applying a liquid material between at least two strips and before said extending a portion of a second continuous sheet of plastic over said electronic assembly.

* * * * *